(12) United States Patent
Gorbachov et al.

(10) Patent No.: US 10,778,157 B2
(45) Date of Patent: Sep. 15, 2020

(54) RF POWER AMPLIFIER CIRCUITS FOR CONSTANT RADIATED POWER AND ENHANCED ANTENNA MISMATCH SENSITIVITY

(71) Applicant: BeRex Inc., Santa Clara, CA (US)

(72) Inventors: Oleksandr Gorbachov, Irvine, CA (US); Lisette L. Zhang, Redondo Beach, CA (US)

(73) Assignee: Berex, Inc., Santa Clara, CA (US)

( * ) Notice: Subject to any disclaimer, the term of this patent is extended or adjusted under 35 U.S.C. 154(b) by 0 days.

(21) Appl. No.: 16/712,149

(22) Filed: Dec. 12, 2019

(65) Prior Publication Data

US 2020/0195206 A1    Jun. 18, 2020

Related U.S. Application Data

(60) Provisional application No. 62/778,457, filed on Dec. 12, 2018.

(51) Int. Cl.
| | |
|---|---|
| *H03F 3/195* | (2006.01) |
| *H03F 3/193* | (2006.01) |
| *H03F 3/24* | (2006.01) |
| *H03G 1/00* | (2006.01) |

(52) U.S. Cl.
CPC ............ *H03F 3/195* (2013.01); *H03F 3/193* (2013.01); *H03F 3/245* (2013.01); *H03G 1/0029* (2013.01); *H03F 2200/451* (2013.01)

(58) Field of Classification Search
CPC .... H03F 2200/451; H03F 3/193; H03F 3/195; H03F 3/245; H03G 1/0029
See application file for complete search history.

(56) References Cited

U.S. PATENT DOCUMENTS

2003/0224743 A1* 12/2003 Okada .................. H03F 1/0205
455/127.2
2010/0109771 A1* 5/2010 Baik .................. H04B 7/15585
330/149

* cited by examiner

*Primary Examiner* — Sung S Ahn
(74) *Attorney, Agent, or Firm* — Eric Karich; Karich & Associates

(57) ABSTRACT

An RF receiver circuit configuration and design limited by conditions and frequencies to simultaneously provide steady state low-noise signal amplification, frequency down-conversion and image signal rejection. The invention provides combined circuits of an RF transceiver architecture that measure antenna reflected power relative to forward power using the error amplifier signal to adjust the gain of the variable gain amplifier in order to compensate for the mismatch between forward reflected power and forward power at the antenna in order to achieve constant radiated power. The RF receiver circuit may be implemented as one of a CMOS single chip device or as part of an integrated system of CMOS components.

14 Claims, 6 Drawing Sheets

RF POWER AMPLIFIER CIRCUITS FOR CONSTANT RADIATED POWER AND ENHANCED ANTENNA MISMATCH SENSITIVITY

CROSS REFERENCE TO RELATED APPLICATIONS

This application for a utility patent claims the benefit of U.S. Provisional Application No. 62/778,457, filed Dec. 12, 2018.

BACKGROUND OF THE INVENTION

Field of the Invention

This invention relates generally to radio frequency (RF) transceiver circuitry, and more particularly, to power amplifier architectures providing constant radiated power and enhanced antenna mismatch sensitivity for use in mobile communications systems.

Description of Related Art

Wireless communications systems find applications in numerous contexts involving information transfer over long and short distances alike, and there exists a wide range of modalities suited to meet the particular needs of each. Chief amongst these systems with respect to popularity and deployment is the mobile or cellular phone.

A fundamental component of any wireless communications system is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Depending on the particulars of the communications modality, single or multiple antennas may be utilized. Conventional transceivers typically do not generate sufficient power or have sufficient sensitivity for reliable communications standing alone. Thus, additional conditioning of the RF signal is necessary. The circuitry between the transceiver and the antenna that provide this functionality is referred to as the front end circuit, which is understood to be comprised of a power amplifier (PA) for increased transmission power, and/or a low noise amplifier (LNA) for increased reception sensitivity. Each band or operating frequency of the communications system may have a dedicated power amplifier and low noise amplifier tuned specifically to that operating frequency. At the design and manufacturing stages of a high volume product all the wireless system blocks are tuned to operate at an optimal condition and so the system performance lags when non-ideal conditions appear. The input and output ports of a transceiver block are always designed to operate with a 50 Ohm antenna impedance. However, in practice the antenna impedance may stray from the ideal due to size constraints and external conditions, and create a mismatch. The typical antenna impedance mismatch could typically be up to a Voltage Standing Wave Ratio (VWSR) of 4:1 and in the worst case 6:1.

Since an RF power amplifier in the final stage of an RF transceiver block is designed to optimally operate with a 50 Ohm antenna impedance, if the antenna does not have 50 Ohm impedance the RF power amplifier will deliver a non-optimal power to the antenna as a result of the mismatch. The power radiated from the antenna into space will be not as designed and the quality of the signal may also be degraded. One approach to solve this problem has been to introduce an isolator between the PA output and the antenna connector wherein the PA always sees a constant impedance near 50 Ohm and thereby delivers a constant power towards the antenna while preserving signal quality. However this approach typically requires bulky and expensive isolators whose performance may not be ideal. Another approach has been to use load insensitive PA architectures to mitigate changes in forward power, which is power directed towards the antenna, but in this case the power radiated into space remains reduced due to antenna mismatch. This is because these solutions rely on fixing constant forward power to the antenna without determining and compensating for power actually delivered into space by the antenna. The present invention is focused on providing architectures that preserve total power radiated into space from an antenna under significantly mismatched conditions. The present invention provides RF transceiver architectures with PA circuits that deliver constant radiated power and LNA circuits that optimize signal reception in the face of antenna mismatch, as well as providing further advantages as described in the following summary.

SUMMARY OF THE INVENTION

The present invention teaches certain benefits in construction and use which give rise to the objectives described below.

A primary objective of the present invention is to provide an RF transceiver architecture including transmitter power amplifier (PA) circuits having advantages not taught by the prior art. The primary objective of the invention is to provide combined circuits of an RF transceiver architecture that measure antenna reflected power relative to forward power, and using the error amplifier signal to adjust the gain of the variable gain amplifier in order to compensate for the mismatch between forward reflected power and forward power at the antenna in order to achieve constant radiated power. An additional objective of the present invention is to provide for mitigation of antenna to PA mismatch and to provide an RF transceiver architecture including an antenna alarm circuit to indicate gross antenna mismatch or disconnected antenna.

An additional objective to the present invention is to provide an RF transceiver architecture including a receiver low noise amplifier (LNA) capable of having its gain adjusted to compensate for antenna mismatch and thereby improve overall RF receiver sensitivity. Finally, the proposed solutions may be integrated into transceiver circuits that are fabricated in CMOS technology or applied as standalone devices. Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention.

DETAILED DESCRIPTION OF THE INVENTION

Various embodiments of an RF transceiver architecture including transmitter power amplifier (PA) circuits having advantages not taught by the prior art are described herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Throughout the specification and claims, the following terms take the meanings explicitly associated herein, unless the context clearly dictates otherwise. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). The term "circuit" means either a single component or a multiplicity of components, either active or passive, that are coupled together to provide a desired function. The term "signal" means at least one current, voltage, or data signal. Although circuit elements may be fabricated on the back side, when reference is made to certain circuit elements residing within or formed in a substrate, this is generally accepted to mean the circuits reside on the front side of the substrate.

The above-described drawing figures illustrate the invention, an RF transceiver architecture (RF front end) providing constant transmit radiated power and enhanced receive sensitivity in the face of a high level of antenna impedance mismatch.

Figure 1:
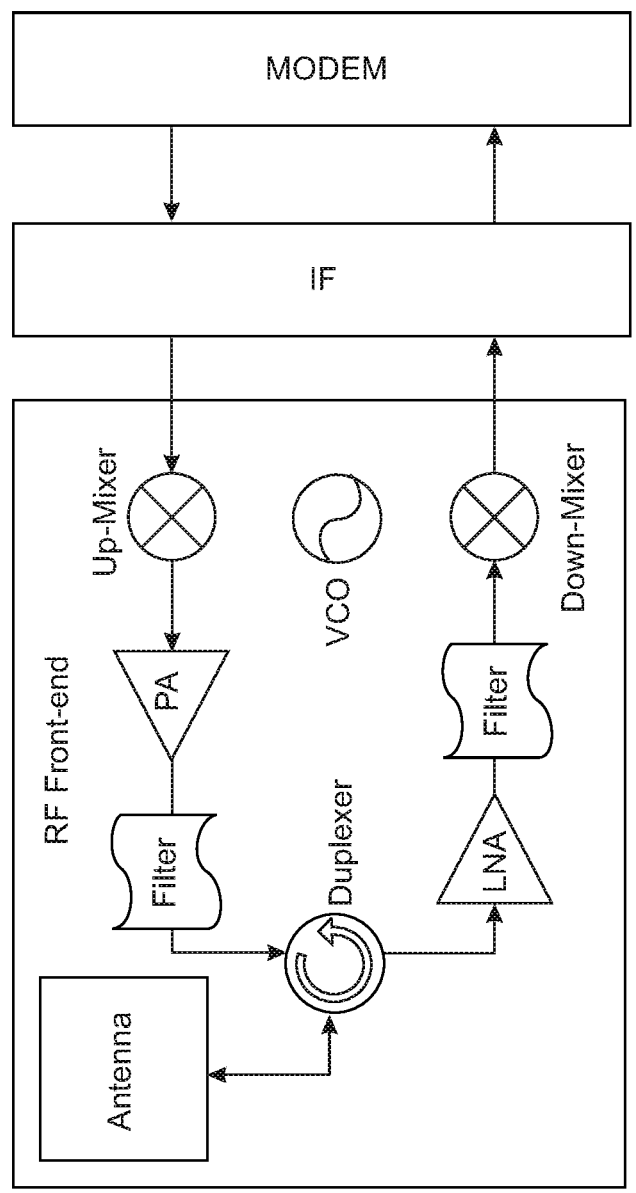
FIG. 1 is a diagram illustrating the circuit blocks found in a typical RF transceiver architecture.

FIG. 1 is a diagram illustrating the circuit blocks found in a typical RF transceiver architecture or RF front end. With the Duplexer switch in a receive mode an RF signal is received at an antenna and picked up by a low noise amplifier LNA and sent on to receiver components such as a filter, down-mixer, IF block, and modem. With the Duplexer switch in transmit mode the antenna receives forward power Pf from a power amplifier PA through a filter and radiates power Prad into space. The antenna impedance may not be exactly matched to the power amplifying transmit circuits and a portion of the forward power may be reflected as reflected power Pr. The antenna impedance may not be exactly matched to the low noise amplifying receive circuits and as a result the receiver sensitivity may be degraded. Also shown in FIG. 1 are a voltage controlled oscillator VCO and an Up-Mixer and a Down-Mixer which are used to up convert and down convert an input RF frequency to an intermediate frequency IF.

Figure 2:
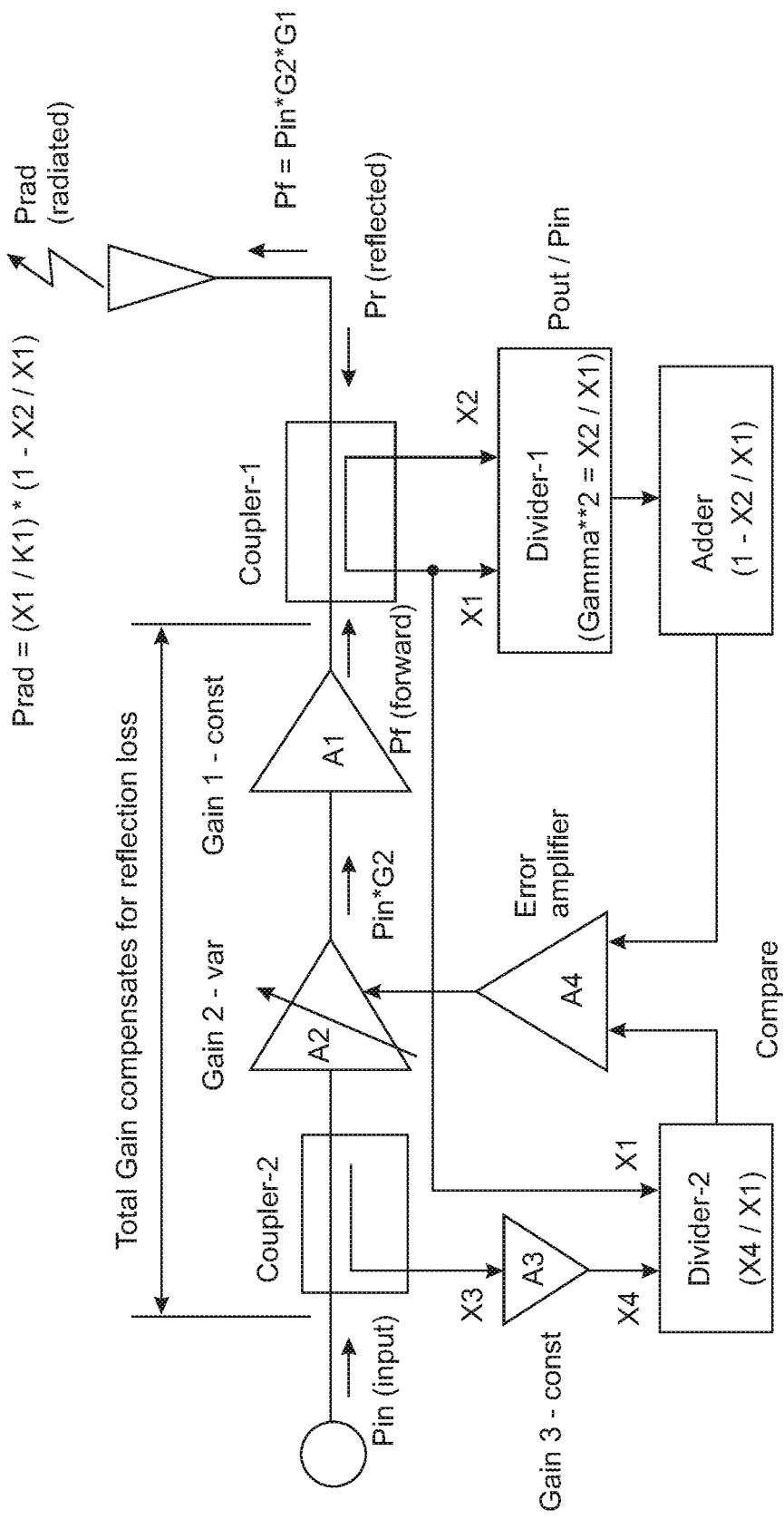
FIG. 2 is an electrical schematic block diagram illustrating a first embodiment of the invention.

FIG. 2 is an electrical schematic block diagram illustrating a first embodiment of the invention. FIG. 2 illustrates a radio frequency (RF) power amplifier architecture and circuits for adjusting output power to achieve constant radiated power delivered to an antenna. Two types of components illustrated are directional couplers and power dividers. A directional coupler is a 4-port device that is used to sample a small amount of input signal power for measurement purposes. There is an input port, an output port, a coupled port, and an isolated/terminated port. When an input signal travels from the input to output ports, a part of this signal is coupled to the coupled port. The portion of the power coupled to the coupled port depends on the coupling value of the coupler being used. The coupling coefficient K is one of the key parameters on the basis of which a directional coupler is selected. Typical coupling values vary from 6 dB to over 30 dB. At the isolated port in an ideal directional coupler, no signal should appear, however practically, a small amount of power called back power is obtained at the isolated port. RF Power Dividers are passive RF devices that split an input signal into two or more output signals with minimal losses. Power dividers are widely used in wireless systems to divide power equally across the system. A power divider is used for devices with tight coupling and commonly a power divider will provide half the input power at each of its output ports (a 3 dB divider), and is usually considered a 3-port device.

FIG. 2 shows a first amplifier A1 which is a load insensitive PA with constant gain Gain1 providing forward power Pf through an output terminal connected to an input port of a four port first directional coupler Coupler-1 with coupling coefficients K1 and K2. An input terminal of amplifier A1 is connected to the output terminal of a variable gain driver amplifier A2 with gain Gain2. A second directional coupler Coupler-2 with coupling coefficient K3 has an output port connected to the input terminal of variable gain driver amplifier A2. An input port of second directional coupler Coupler-2 receives an RF input signal Pin. An antenna, designated by a triangle, is connected to and receiving forward power Pf from the output port of the first directional coupler Coupler-1. The antenna is also reflecting power Pr into the output port of the first directional coupler Coupler-1. The power radiated from the antenna into space is Prad= (Pf−Pr). A first divider circuit Divider-1 has a first port connected to and receiving power X1=(K1×Pf) from the coupled port of the first directional coupler Coupler-1 and has a second port connected to and receiving power X2= (K2×Pr) from the isolation port of the first directional coupler Coupler-1. The first divider circuit Divider-1 outputs a value (X2/X1) from an output terminal to an adder circuit Adder input terminal wherein adder circuit Adder outputs the addition (1−X2/X1) to an output terminal. A second amplifier A3 with constant gain Gain3 has an input terminal connected to and receiving power X3=(K3×Pin) from a coupled port of second directional coupler Coupler-2. The output terminal of second amplifier A3 delivers power X4=(Gain3×X3) to a first port of a second divider circuit Divider-2. A second port of second divider circuit Divider-2 is connected to the first port of first divider circuit Divider-1. Second divider circuit Divider-2 outputs a value (X4/X1) from an output terminal. An error amplifier A4 has a first input connected to and receiving a power value (X4/X1)

from the output terminal of second divider circuit Divider-2 and also has a second input connected to and receiving a power value (1−X2/X1) from the output terminal of adder circuit Adder. The output of error amplifier A4 is connected to and adjusts the gain of variable gain driver amplifier A2. In operation the combined circuits measure antenna reflected power relative to forward power and uses the error amplifier signal to adjust the gain of the variable gain amplifier in order to compensate for the mismatch between forward reflected power and forward power at the antenna in order to achieve constant radiated power.

The embodiment illustrated in FIG. 2 as well as all the other embodiments described herein assumes an antenna impedance of 50 Ohms along with 50 Ohm connecting line impedances. In this architecture the overall gain can be adjusted by changing the constant gain Gain3 of amplifier A3. Also constant gain amplifier A3 functions to compensate for the difference in coupling coefficients K1 and K3 as well setting the total required gain at 50 Ohms. The invented architecture can operate with time domain duplex (TDD) or frequency domain duplex (FDD) wireless systems. A further benefit of the invented architecture is that it provides constant gain when the circuit is implemented in CMOS technology and can then compensate for fabrication process variation as well as operating temperature variation.

Figure 3:
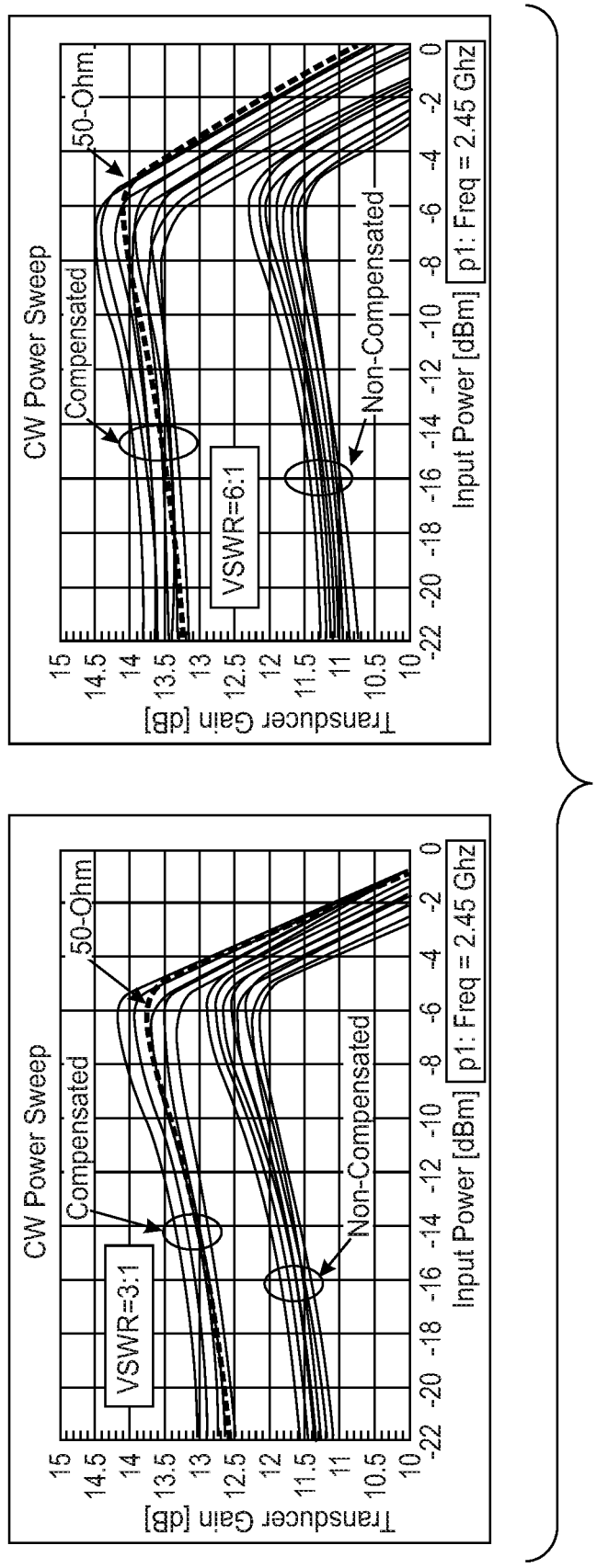
FIG. 3 shows CW power sweep simulation plots illustrating the improvements related to the first embodiment invention at VSWR of 3:1 and 6:1.

FIG. 3 shows continuous wave (CW) power sweep simulation plots illustrating the improvements related to the first embodiment of the invention. Transducer Gain is plotted versus Input Power for antenna mismatches of VSWR of 3:1 and 6:1. Significant improvement in transducer gain is shown for the compensated circuit architecture and more so at higher VSVR.

Figure 4:
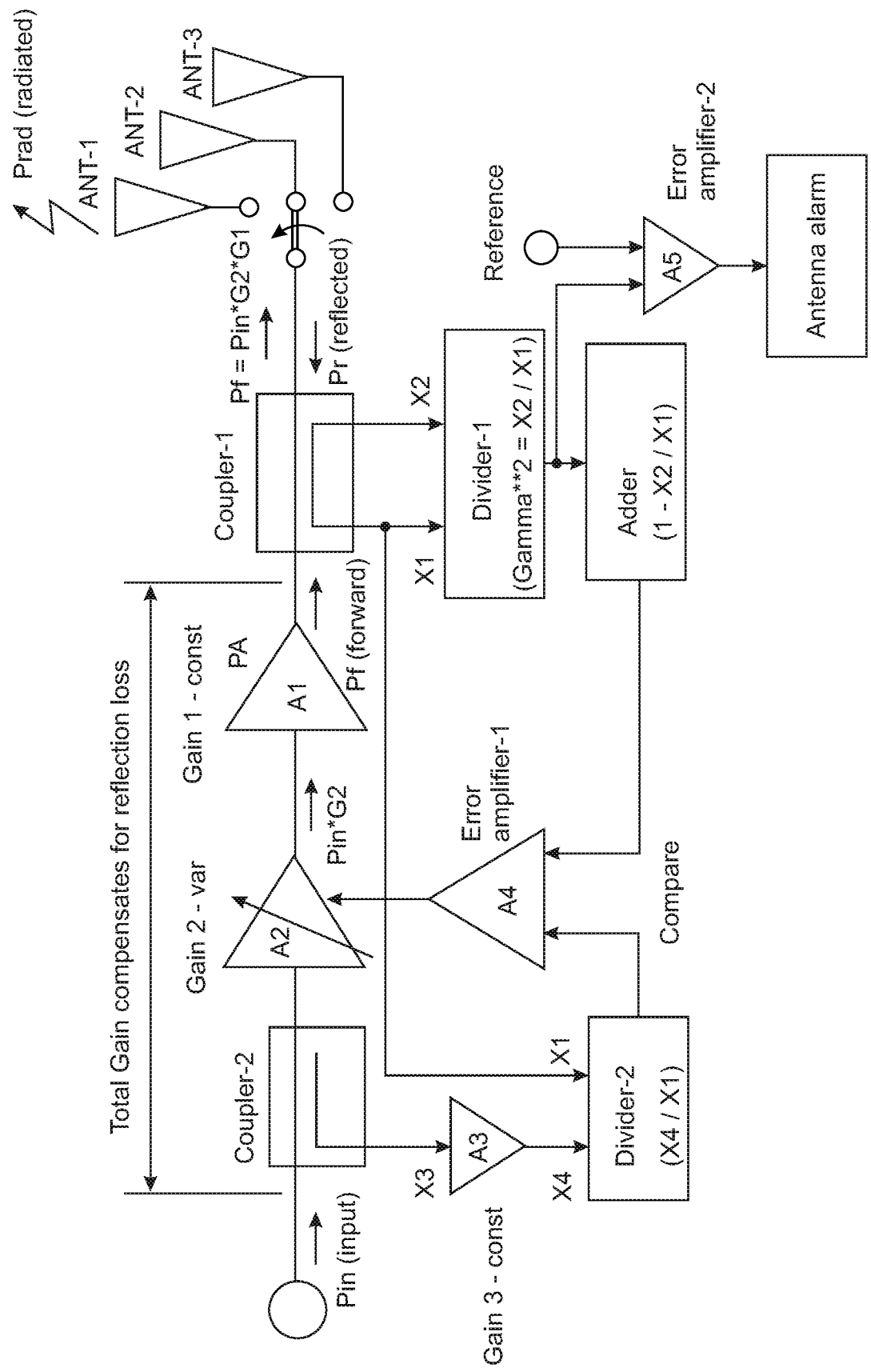
FIG. 4 is an electrical schematic block diagram illustrating a second embodiment of the invention.

FIG. 4 is an electrical schematic block diagram illustrating a second embodiment of the invention. The architecture and circuits are the same as shown in FIG. 2 with the addition of a feature that includes multiple antennas and that can detect and alarm when an antenna mismatch exceeds a pre-defined level. In FIG. 4 the antenna shown in FIG. 2 is replaced with one or more antennas each separately connectable through a switch and when connected receiving forward power Pf from the output port of first directional coupler Coupler-1, and sending reflecting power Pr into the output port of first directional coupler Coupler-1. The second embodiment also includes a second error amplifier (Error amplifier-2) A5 with a first input connected to the output terminal of first divider circuit Divider-1 and with a second input connected to a reference signal Reference. A reference level Br defines the level expected to represent a broken or disconnected antenna. When reference level Br is exceeded an output of second error amplifier A5 is connected to an alarm and initiates an alarm signal. In this second embodiment the combined circuits measure antenna reflected power relative to forward power using an error amplifier signal to adjust the gain of a variable gain amplifier in order to compensate for the mismatch between forward reflected power and forward power at the antenna, and wherein a second error amplifier drives the antenna alarm when the power mismatch exceeds a set level Br, for example, when an antenna becomes broken or unconnected to the circuit. With this embodiment a wireless system can detect a bad or broken antenna and exclude it from the operation of the system.

Figure 5:
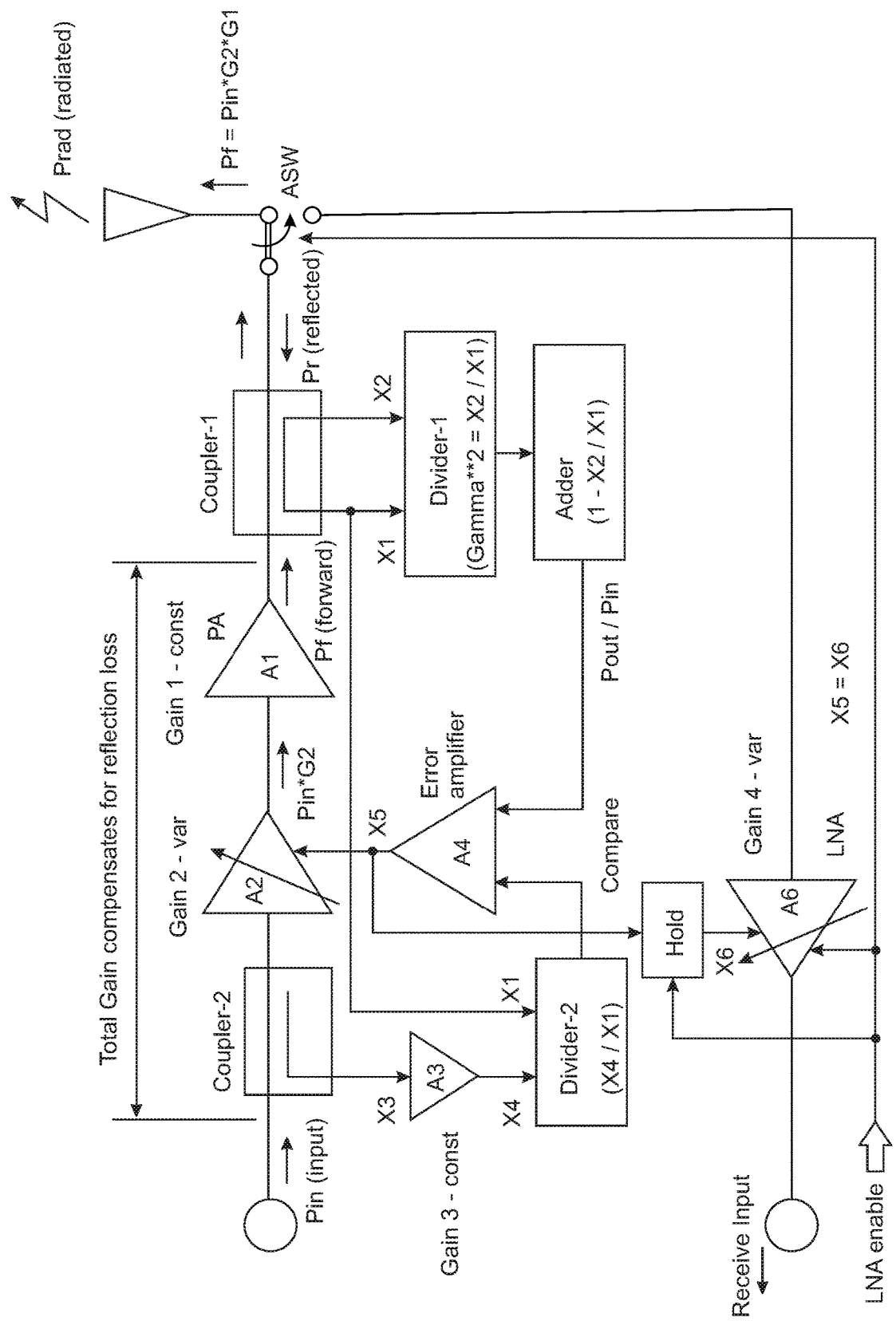
FIG. 5 is an electrical schematic block diagram illustrating a third embodiment of the invention.

FIG. 5 is an electrical schematic block diagram illustrating a third embodiment of the invention. The architecture and circuits are the same as shown in FIG. 2 with the addition of a feature that includes the addition of a low noise amplifier receiver section which may have increased sensitivity due to the gain modification related to antenna mismatch compensation. In FIG. 5 the antenna shown in FIG. 2 is replaced with an antenna connected to the single pole of a SPDT antenna mode switch ASW. When switch ASW is switched into a transmit mode of the architecture the antenna is connected to a first of the double poles of switch ASW and the antenna receives forward power Pf from the output port of first directional coupler Coupler-1and sends reflecting power Pr into the output port of first directional coupler Coupler-1. Also added to the architecture and circuits of FIG. 2 is a receiver low noise amplifier A6 with variable gain with an input connected, when ASW is switched into a receive mode rather than into the transmit mode, to the antenna through a second of the dual poles of switch ASW. Also added is a hold circuit Hold for holding a signal value X5 with a first input connected to the output terminal of error amplifier A5 and an output connected to low noise amplifier A6 wherein the hold circuit Hold provides the signal value X5 to adjust the gain of low noise amplifier A6 during the receive mode of switch ASW. Finally added is an LNA enable signal line connected to a second input of hold circuit Hold and also connected to low noise amplifier A6 and also connected to the antenna switch wherein, when switch ASW is switched into receive mode of the architecture, the gain of A6 is set to the same value as variable gain driver amplifier A2 had during the transmit mode of the architecture. All the combined circuits measure antenna reflected power relative to forward power using the error amplifier signal to adjust the gain of the variable gain amplifier in order to compensate for the mismatch between forward reflected power and forward power at the antenna in a transmit mode, and then apply the same gain to a variable gain low noise amplifier in a receive mode.

Figure 6:
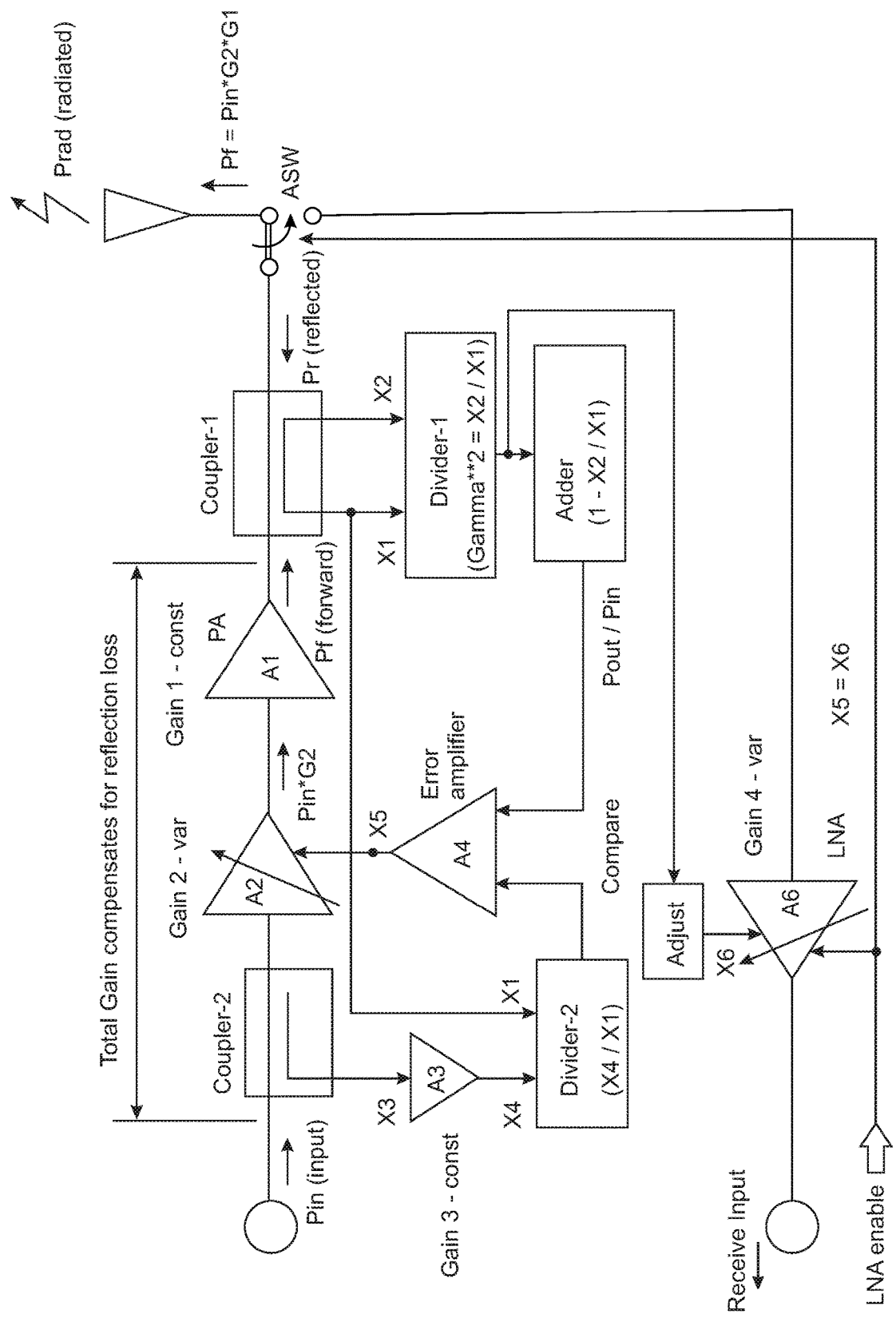
FIG. 6 is an electrical schematic block diagram illustrating a fourth embodiment of the invention.

FIG. 6 is an electrical schematic block diagram illustrating a fourth embodiment of the invention. The architecture and circuits are the same as shown in FIG. 5 except that the hold circuit Hold is replaced with an adjust circuit Adjust. This provides an alternate method to set the gain of low noise amplifier A6 receiver section which may have increased sensitivity due to the gain modification related to antenna mismatch compensation. In FIG. 6 the hold circuit shown in FIG. 5 is replaced with an adjust circuit Adjust with a first input connected to the output terminal of divider circuit Divider-1 and an output connected to low noise amplifier A6. Adjust circuit Adjust sets, typically reducing, the gain the gain of low noise amplifier A6 during the receive mode of switch ASW in order to prevent saturation of subsequent amplifier stages in the receive architecture circuits. The output of divider circuit Divider-1 provides the adjust circuit signal level. The adjust circuit also has the capability to bypass the low noise amplifier if the situation warrants.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A radio frequency (RF) power amplifier architecture and circuits for adjusting output power to achieve constant radiated power delivered to an antenna, comprising:
    a first amplifier with constant gain G1 providing forward power Pf through an output terminal connected to an input port of a four port first directional coupler with coupling coefficients K1 and K2 and with an input terminal of the first amplifier connected to the output terminal of a variable gain driver amplifier with gain G2;
    a second directional coupler with coupling coefficient K3 with an output port connected to the input terminal of the variable gain driver amplifier and an input port of the second directional coupler receiving a RF input signal Pin;
    an antenna connected to and receiving forward power Pf from the output port of the first directional coupler and sending reflecting power Pr into the output port of the first directional coupler;
    a first divider circuit with its first port connected to and receiving power X1=K1×Pf from the coupled port of the first directional coupler and its second port connected to and receiving power X2=K2×Pr from the isolation port of the first directional coupler, wherein the first divider outputs a value X2/X1 from an output terminal to an adder circuit input terminal, wherein the adder circuit outputs the addition 1−X2/X1 to an output terminal;
    a second amplifier with constant gain G3 and with its input terminal connected to and receiving power X3=K3×Pin from a coupled port of the second directional coupler and with its output terminal delivering power X4=G3×X3 to a first port of a second divider circuit, wherein a second port of the second divider circuit is connected to the first port of the first divider circuit and wherein the second divider circuit outputs a value X4/X1 from an output terminal;
    an error amplifier with a first input connected to and receiving a power value X4/X1 from the output terminal of the second divider circuit and with a second input connected to and receiving a power value 1−X2/X1 from the output terminal of the adder circuit wherein an output of the error amplifier is connected to and adjusts the gain of the variable gain driver amplifier; and
    wherein the combined circuits measure antenna reflected power relative to forward power using the error amplifier signal to adjust the gain of the variable gain amplifier in order to compensate for the mismatch between forward reflected power and forward power at the antenna.

2. The RF power amplifier circuit of claim 1, wherein the antenna impedance and impedance of the power transfer lines are 50 Ohm.

3. The RF power amplifier circuit of claim 1, wherein the variable gain amplifier is replaced with a variable attenuator circuit.

4. A radio frequency (RF) power amplifier architecture and circuits for adjusting output power to achieve constant radiated power delivered to multiple antennas, comprising:
    a first amplifier with constant gain G1 providing forward power Pf through an output terminal connected to an input port of a four port first directional coupler with coupling coefficients K1 and K2 and with an input terminal of the first amplifier connected to the output terminal of a variable gain driver amplifier with gain G2;
    a second directional coupler with coupling coefficient K3 with an output port connected to the input terminal of the variable gain driver amplifier and an input port of the second directional coupler receiving a RF input signal Pin;
    one or more antennas each separately connectable through a switch and, when connected, receiving forward power Pf from the output port of the first directional coupler and sending reflecting power Pr into the output port of the first directional coupler;
    a first divider circuit with its first port connected to and receiving power X1=K1×Pf from the coupled port of the first directional coupler and its second port connected to and receiving power X2=K2×Pr from the isolation port of the first directional coupler, wherein the first divider outputs a value X2/X1 from an output terminal to an adder circuit input terminal, wherein the adder circuit outputs the addition 1−X2/X1 to an output terminal;
    a second amplifier with constant gain G3 and with its input terminal connected to and receiving power X3=K3×Pin from a coupled port of the second directional coupler and with its output terminal delivering power X4=G3×X3 to a first port of a second divider circuit, wherein a second port of the second divider circuit is connected to the first port of the first divider circuit and wherein the second divider circuit outputs a value X4/X1 from an output terminal;
    an first error amplifier with a first input connected to and receiving a power value X4/X1 from the output terminal of the second divider circuit and with a second input connected to and receiving a power value 1−X2/X1 from the output terminal of the adder circuit wherein an output of the first error amplifier is connected to and adjusts the gain of the variable gain driver amplifier;
    a second error amplifier with a first input connected to the output terminal of the first divider circuit and with a second input connected to a reference signal with a level Br defining the level expected to represent a broken or disconnected antenna wherein an output of the second error amplifier is connected to and drives an alarm signal; and wherein the combined circuits measure antenna reflected power relative to forward power using the error amplifier signal to adjust the gain of the variable gain amplifier in order to compensate for the mismatch between forward reflected power and forward power at the antenna, and wherein the second error amplifier drives the antenna alarm when the power mismatch exceeds a set level Br, for example when an antenna becomes broken or unconnected to the circuit.

5. The RF power amplifier circuit of claim 4, wherein the antenna impedance and impedance of the power transfer lines are 50 Ohm.

6. The RF power amplifier circuit of claim 4, wherein the variable gain amplifier is replaced with a variable attenuator circuit.

7. The RF power amplifier circuit of claim 4 wherein the second error amplifier level L is less than a Voltage Standing Wave Ratio (VSWR) of 6:1, wherein Pr is one half of Pf.

8. A radio frequency (RF) power amplifier architecture and circuits for adjusting output power to achieve constant radiated power delivered to an antenna along with a low noise amplifier with enhanced signal receiving sensitivity comprising:

a first amplifier with constant gain G1 providing forward power Pf through an output terminal connected to an input port of a four port first directional coupler with coupling coefficients K1 and K2 and with an input terminal of the first amplifier connected to the output terminal of a variable gain driver amplifier with gain G2;

a second directional coupler with coupling coefficient K3 with an output port connected to the input terminal of the variable gain driver amplifier and an input port of the second directional coupler receiving a RF input signal Pin;

an antenna connected to the single pole of a SPDT antenna mode switch ASW and when switched in a transmit mode to a first of the double poles of switch ASW receives forward power Pf from the output port of the first directional coupler and sends reflecting power Pr into the output port of the first directional coupler;

a first divider circuit with its first port connected to and receiving power X1=K1×Pf from the coupled port of the first directional coupler and its second port connected to and receiving power X2=K2×Pr from the isolation port of the first directional coupler, wherein the first divider outputs a value X2/X1 from an output terminal to an adder circuit input terminal, wherein the adder circuit outputs the addition 1−X2/X1 to an output terminal;

a second amplifier with constant gain G3 and with its input terminal connected to and receiving power X3=K3×Pin from a coupled port of the second directional coupler and with its output terminal delivering power X4=G3×X3 to a first port of a second divider circuit, wherein a second port of the second divider circuit is connected to the first port of the first divider circuit and wherein the second divider circuit outputs a value X4/X1 from an output terminal;

an error amplifier with a first input connected to and receiving a power value X4/X1 from the output terminal of the second divider circuit and with a second input connected to and receiving a power value 1−X2/X1 from the output terminal of the adder circuit wherein an output of the error amplifier with value X5 is connected to and adjusts the gain of the variable gain driver amplifier;

a receiver low noise amplifier LNA with variable gain with an input connected to the antenna through a second of the dual poles of switch ASW when ASW is switched into a receive mode rather than into the transmit mode;

a hold circuit for holding signal value X5 with a first input connected to the output terminal of the error amplifier and an output connected to the low noise amplifier and adjusts the gain of the low noise amplifier during the receive mode of switch ASW;

an LNA enable signal line connected to a second input of the hold circuit and to the low noise amplifier and to the antenna switch wherein when switch ASW is switched into receive mode the gain of the LNA is set to the same value as the variable gain driver amplifier had during the transmit mode; and wherein the combined circuits measure antenna reflected power relative to forward power using the error amplifier signal to adjust the gain of the variable gain amplifier in order to compensate for the mismatch between forward reflected power and forward power at the antenna in a transmit mode and then apply the same gain to a variable gain low noise amplifier in a receive mode.

9. The RF power amplifier circuit of claim 8, wherein the antenna impedance and impedance of the power transfer lines are 50 Ohm.

10. The RF power amplifier circuit of claim 8, wherein the variable gain amplifier is replaced with a variable attenuator circuit.

11. A radio frequency (RF) power amplifier architecture and circuits for adjusting output power to achieve constant radiated power delivered to an antenna along with a low noise amplifier with a guard against large antenna signals, comprising:

a first amplifier with constant gain G1 providing forward power Pf through an output terminal connected to an input port of a four port first directional coupler with coupling coefficients K1 and K2 and with an input terminal of the first amplifier connected to the output terminal of a variable gain driver amplifier with gain G2;

a second directional coupler with coupling coefficient K3 with an output port connected to the input terminal of the variable gain driver amplifier and an input port of the second directional coupler receiving a RF input signal Pin;

an antenna connected to the single pole of a SPDT antenna mode switch ASW and when switched in a transmit mode to a first of the double poles of switch ASW receives forward power Pf from the output port of the first directional coupler and sends reflecting power Pr into the output port of the first directional coupler;

a first divider circuit with its first port connected to and receiving power X1=K1×Pf from the coupled port of the first directional coupler and its second port connected to and receiving power X2=K2×Pr from the isolation port of the first directional coupler, wherein the first divider outputs a value X2/X1 from an output terminal to an adder circuit input terminal, wherein the adder circuit outputs the addition 1−X2/X1 to an output terminal;

a second amplifier with constant gain G3 and with its input terminal connected to and receiving power X3=K3×Pin from a coupled port of the second directional coupler and with its output terminal delivering power X4=G3×X3 to a first port of a second divider circuit, wherein a second port of the second divider circuit is connected to the first port of the first divider circuit and wherein the second divider circuit outputs a value X4/X1 from an output terminal;

an error amplifier with a first input connected to and receiving a power value X4/X1 from the output terminal of the second divider circuit and with a second input connected to and receiving a power value 1−X2/X1 from the output terminal of the adder circuit wherein an output of the error amplifier with value X5 is connected to and adjusts the gain of the variable gain driver amplifier;

a receiver low noise amplifier LNA with variable gain with an input connected to the antenna through a second of the dual poles of switch ASW when ASW is switched into a receive mode rather than into the transmit mode;

an adjust circuit with a first input connected to the output terminal of the first divider circuit and an output connected to the low noise amplifier and adjusts the gain of the low noise amplifier during the receive mode of switch ASW;

an LNA enable signal line connected to the low noise amplifier and to the antenna switch wherein when switch ASW is switched into receive mode the gain of the LNA is set to the same value as the output of the first divider circuit; and wherein the combined circuits measure antenna reflected power relative to forward power using the error amplifier signal to adjust the gain of the variable gain amplifier in order to compensate for the mismatch between forward reflected power and forward power at the antenna in a transmit mode and then apply a lower gain to a variable gain low noise amplifier in a receive mode in order to avoid saturating subsequent input stages if the antenna signal is excessive.

12. The RF power amplifier circuit of claim 11, wherein the antenna impedance and impedance of the power transfer lines are 50 Ohm.

13. The RF power amplifier circuit of claim 11, wherein the variable gain amplifier is replaced with a variable attenuator circuit.

14. The RF power amplifier circuit of claim 11, wherein the circuits less the antenna are implemented in a CMOS single chip integrated circuit.

* * * * *